United States Patent
Vetrovec

(10) Patent No.: US 8,023,542 B2
(45) Date of Patent: Sep. 20, 2011

(54) HIGH ENERGY LASER THERMAL MANAGEMENT

(75) Inventor: Jan Vetrovec, Larkspur, CO (US)

(73) Assignee: The Boeing Company, Chicago, IL (US)

(*) Notice: Subject to any disclaimer, the term of this patent is extended or adjusted under 35 U.S.C. 154(b) by 869 days.

(21) Appl. No.: 11/961,453

(22) Filed: Dec. 20, 2007

(65) Prior Publication Data
US 2010/0254419 A1    Oct. 7, 2010

Related U.S. Application Data

(62) Division of application No. 11/269,999, filed on Nov. 9, 2005, now abandoned.

(51) Int. Cl.
*H01S 3/042* (2006.01)
(52) U.S. Cl. ............................................. 372/35; 372/34
(58) Field of Classification Search .............. 372/34, 372/35, 36; *H01S 3/042*
See application file for complete search history.

(56) References Cited

U.S. PATENT DOCUMENTS

| | | | |
|---|---|---|---|
| 3,869,870 A | 3/1975 | Kuehner | |
| 4,219,072 A * | 8/1980 | Barlow, Sr. | 165/276 |
| 4,388,044 A | 6/1983 | Wilkinson | |
| 4,586,185 A | 4/1986 | DeWilde et al. | |
| 5,477,706 A | 12/1995 | Kirol et al. | |
| 6,307,871 B1 * | 10/2001 | Heberle | 372/34 |
| 2001/0015712 A1 | 8/2001 | Hashimoto | |
| 2004/0069454 A1 | 4/2004 | Bonsignore et al. | |
| 2004/0095974 A1 * | 5/2004 | Gibson | 372/35 |
| 2004/0141539 A1 | 7/2004 | Delgado, Jr. et al. | |
| 2007/0104233 A1 | 5/2007 | Vetrovec | |

* cited by examiner

*Primary Examiner* — Jessica Stultz
*Assistant Examiner* — Joshua King
(74) *Attorney, Agent, or Firm* — Haynes & Boone, LLP.

(57) ABSTRACT

Methods and systems are disclosed for cooling a laser, such as a high average power (HAP) solid state laser (SSL). A coolant that has been heated from previous use can be conditioned by transferring heat from the coolant to a phase change medium. The conditioned coolant can then be re-used to cool the laser. In this manner, a low cost, lightweight, compact cooling system that generates comparatively quiescent flow at comparatively high flow rates can be provided.

18 Claims, 3 Drawing Sheets

HIGH ENERGY LASER THERMAL MANAGEMENT

CROSS-REFERENCE TO RELATED APPLICATIONS

This application is a divisional application of U.S. application Ser. No. 11/269,999, filed Nov. 9, 2005, now abandoned, now U.S. Patent Publication No. 20070104233, which is incorporated herein by reference in its entirety.

TECHNICAL FIELD

The present invention relates generally to thermodynamics and, more particularly, to a heat management system, such as for a high energy solid state laser.

BACKGROUND

High average power (HAP) solid state laser (SSL) systems are known. They are becoming increasingly important in both defense and commercial applications. Much of the recent growth in the popularity of SSL systems can be attributed to the introduction of pumping by laser diodes.

As those skilled in the art will appreciate, diodes are inherently very efficient in converting electric energy into pump light. Thus, diodes deposit only a comparatively small amount of waste heat into the solid state medium. Advantages of diode pumped SSL systems with respect to gas lasers include all electric operation, short wavelength, compatibility of optical fibers, continuous duty, high efficiency, and the prospect of engineering a high power device having a comparatively small and lightweight package.

Emerging military and industrial applications for HAP SLL systems required the integration of laser systems on mobile platforms such as trucks, ships, and aircraft. More particularly, there is a strong need for 100 kW class HAP SSL systems for use in air defense and precision strike. Air defense applications for HAP SSL include defense against tactical and strategic missiles. HAP SSL systems are also used worldwide in industrial applications, such as in cutting and welding tools for use in the automotive, aerospace, appliance, and shipbuilding industries.

Solid-state lasers utilize electrical pumping, such as by the use of highly efficient semiconductor diodes. Despite the use of such electrical pumping, the operation of SSL systems still produces a significant amount of waste heat that must be rejected. Typically, for each joule of laser energy produced, three to four joules of heat must be removed from a SSL system and then rejected to the environment.

Rejecting waste heat from a SSL system into an environment that is at the same or higher temperature with respect to the SSL system inherently necessitates the use of refrigeration in order to pump the heat from laser components into the environment. A variety of cooling systems of this type are commercially available and currently used in many applications. Indeed, closed loop cooling systems are commonly used with contemporary SSL systems. However, such closed loop cooling systems tend to be undesirably bulky and heavy in comparison to the SSL system that they support.

The size and weight of the refrigeration system is not of particular concern in fixed laser installations, e.g., factory installations. However, such closed loop refrigeration systems are entirely unsuitable for use in large, e.g., multi kW, SSL systems that are installed upon mobile platforms where size and weight are paramount.

Furthermore, producing the very high flow rates (hundreds of gallons per minute) required to support high energy SSL lasing requires the use of very large pumps that are typically electrically operated. These pumps can require 20%-30% of the SSL system's electric power budget.

Furthermore, such pumps generate substantial flow vibrations that can have a wide band spectrum. The wide band spectrum tends to find resonances in coolant lines and structures. These resonances tend to undesirably perturb the alignment of laser components.

Thus, contemporary cooling systems for high average power solid state laser systems suffer from inherent disadvantages that tend to detract from their overall desirability and effectiveness. For example, contemporary cooling systems tend to be undesirably bulky, heavy, and costly. They also tend to generate excessive flow vibration, particularly at the high flow rates that are required to provide effective cooling.

In view of the foregoing, it is desirable to provide a lightweight, compact, low cost thermal management system for a high energy solid state laser (SSHEL) weapon. It is further desirable to provide such a thermal management system that has very quiescent flow of coolant at the flow rates required for effective cooling. Such a thermal management system would facilitate the construction of more powerful and more economical high average power solid state laser systems.

SUMMARY

Systems and methods are disclosed herein to provide for the cooling of a laser, such as a high average power (HAP) solid state laser (SSL). Such lasers are suitable for use in high power military and industrial applications. According to one embodiment of the present invention, the down time between laser shots can be used to condition coolant so that the coolant is prepared for next round of laser cooling. According to another embodiment of the present invention, the coolant is conditioned in real time, i.e., immediately prior to and/or during use thereof for laser cooling.

More particularly, the laser can be cooled using a liquid coolant. Heat absorbed from the laser by the coolant is subsequently, e.g., between laser firings and/or immediately prior to reuse, transferred from the coolant to a phase change medium. In this manner, the coolant is conditioned for use in the next round of laser firing and cooling. That is, the conditioned coolant is at a temperature such that it is ready to once again cool the laser.

The coolant can be stored in a first tank prior to cooling the laser and can be stored in a second tank subsequent to cooling the laser. Thus, the coolant can flow from the first tank, to the laser (where it cools the laser), and then to the second tank.

For example, the coolant can be stored in the first tank prior to cooling the laser. This is coolant that is at a temperature suitable for cooling the laser, and thus may have already been cooled (as would be necessary if it had recently been used to cool the laser). After cooling the laser, the coolant can be communicated to the second tank. Then, the coolant can be cooled by transferring heat therefrom to a phase change medium. Then, the coolant can be communicated back to the first tank after being cooled.

As a further example, the coolant can be stored in a first tank. This can be coolant that has recently been used to cool the laser and that has not yet been cooled. The coolant can be cooled by transferring heat therefrom to a phase change medium prior to using the coolant to cool the laser. After cooling the laser, the coolant is communicated to a second tank. In this instance, the coolant can be communicated back to the first tank after being communicated to the second tank and is not cooled by communicating heat therefrom to the phase change medium until after it leaves the first tank on its way once again to the laser.

Heat can be transferred from the phase change medium, such as via the use of a refrigerator. That is, a refrigerator can be used to cool the coolant after the coolant has cooled the laser. The phase change medium can comprises paraffin wax, Glauber salt, or any other suitable substance. Advantage is taken of the phase change medium's ability to absorb a large amount of heat during its phase change. For example, paraffin wax absorbs a large amount of heat as it melts from a solid state to a liquid state.

Pressurized gas can be used to cause the coolant to flow between the first tank, the second tank, the laser, and the phase change medium. Undesirable mixing of the coolant and the pressurized gas can be prevented via the use of a diaphragm, a bladder, or the like. The diaphragm, bladder or other structure can also inhibit sloshing of the coolant and the pressurized gas.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
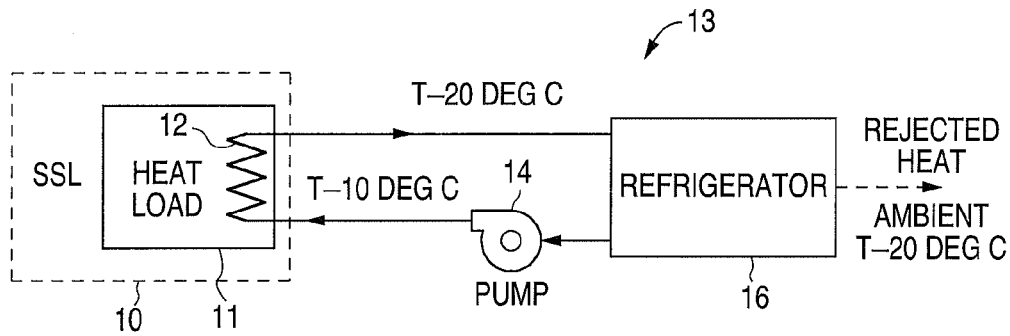
FIG. 1 shows a block diagram illustrating a system for cooling a solid state laser in accordance with contemporary practice.

At least one embodiment of the present invention provides a simple, rugged, efficient, inexpensive, compact, and lightweight thermal management system for a laser, such as a laser of a high average power (HAP) solid state laser (SSL) system. Thus, one or more embodiments of the present invention are suitable for use on mobile platforms such as trucks, trains, ships, aircraft, missiles, satellites, and spacecraft.

According to one aspect, the present invention takes advantage of the fact that unlike industrial SSL's which operate continuously, a HAP SSL fires discrete shots. In particular, HAP SSL shots are typically 5 to 10 seconds long and they are separated by 10 or more seconds of down time.

According to one embodiment, the present invention uses the down-time between shots to condition the coolant and prepare it for another round of cooling. The subject invention can use two pressurized coolant tanks together with transfer lines and control valves to move a coolant from one tank to another with the HAP SSL therebetween.

The coolant can be water, such as deionized water. The coolant can also be a fluid that is resistant to freezing, such as ethylene glycol or a mixture of water and alcohol. The coolant can also be any desired combination of water and a freeze resistant substance. Indeed, as those skilled in the art will appreciate, the coolant can be a wide variety of substances or combinations of substances.

The motive force for transferring the coolant can be provided by pressure differential between the two tanks. The pressure differential can be high enough to overcome HAP SSL flow impedances. The pressure can generated by a gas provided by a compressor or at least one pressurized gas bottle. Optionally, the tanks can have diaphragms or bladders to prevent mixing of the pressurized gas and the liquid coolant and/or to mitigate sloshing of the liquid coolant when the HAP SSL platform executes maneuvers. Preventing the gas and the liquid from mixing can be critical to preventing the gas from coming out of the solution inside cooled components, e.g., after a pressure drop, and for providing a consistent cooling action.

The pressurized gas can comprise nitrogen, helium, carbon dioxide or air. As those skilled in the art will appreciate, the pressurized gas can comprise a wide variety of different gases or combinations of gases.

To maintain temperature of the coolant at a constant level, the thermal management system of the present invention utilizes a phase change medium (PCM) heat exchanger (HEX). Thus, the waste heat of the HAP SSL is deposited into the phase change medium of the heat exchanger, where it melts at least a portion of a phase change medium. Multiple shots of the laser may be required to melt the entire phase change medium. One example of a suitable phase change medium heat exchanger is disclosed by Delgado et al. in U.S. patent publication 20040141539, Ser. No. 731,311, published on Jul. 22, 2004 and entitled Phase-Change Heat Exchanger, the entire contents of which are expressly incorporated herein by reference. There are also suitable phase change materials that are available commercially.

The phase change medium can comprises paraffin wax, Glauber salt, or any other suitable substance. Those skilled in the art will appreciate that various different phase change mediums are suitable.

The phase change medium heat exchanger can be further connected to a refrigerator. Such connection can be accomplished via a thermally conductive member of a separate cooling loop. The refrigerator can extract heat from the phase change medium heat exchanger and thereby restore the phase change medium back to its solid state. Although the process of restoring the phase change medium back to its solid state may take a comparatively long time (as compared to the process of melting the phase change medium), in many instances it can be done fast enough to condition the phase change medium for the next shot of the HAP SSL. In any event, the coolant will be quickly conditioned for the next use of the HAP SSL. Thus, the time required for reconditioning of the phase change medium will not inhibit immediate reuse of the HAP SSL.

It is worthwhile to note that while HAP SSL operation consists of several (such as about 10-20) shots lasting about 5-10 seconds each, the phase change medium can be conditioned for an extended period of time (such as about an hour).

During this recovery period, the phase change medium heat exchanger batteries can be recharged.

Complete reconditioning of the phase change medium can make it ready to be used for a plurality of shots of the HAP SSL. Optionally, the phase change medium can be used for one or more shots of the HAP SSL after partial reconditioning (before it is completely re-solidified).

Since the recovery period can be a comparatively long time, the refrigerator used to condition the phase change medium can be a relatively small unit. Thus, the large, heavy, and costly refrigerator required for the cooling of contemporary HAP SSL's is not necessary. Further, the undesirable flow vibration and consequent misalignment of critical components of the HAP SSL are substantially mitigated because the smaller refrigerator inherently has smaller flow rates (and thus less vibration) associated therewith.

FIG. 1 shows a contemporary HAP SSL system wherein SSL system 10 creates a heat load 11. A heat exchanger 12 of a thermal management system 13 extracts heat from heat load 11. Fluid that is pumped through heat exchanger 12 by pump 14 is communicated to refrigerator 16, which removes heat from the fluid and thereby conditions the fluid for reuse.

This brute force system requires the use of a comparatively large refrigerator 16, since refrigerator 16 is directly responsible for immediately effecting cooling of SSL system 10. By way of contrast, the present invention can use a substantially smaller refrigerator, with the consequent advantages discussed herein, because the refrigerator is not directly responsible for immediately effecting cooling of the SSL system.

Figure 2:
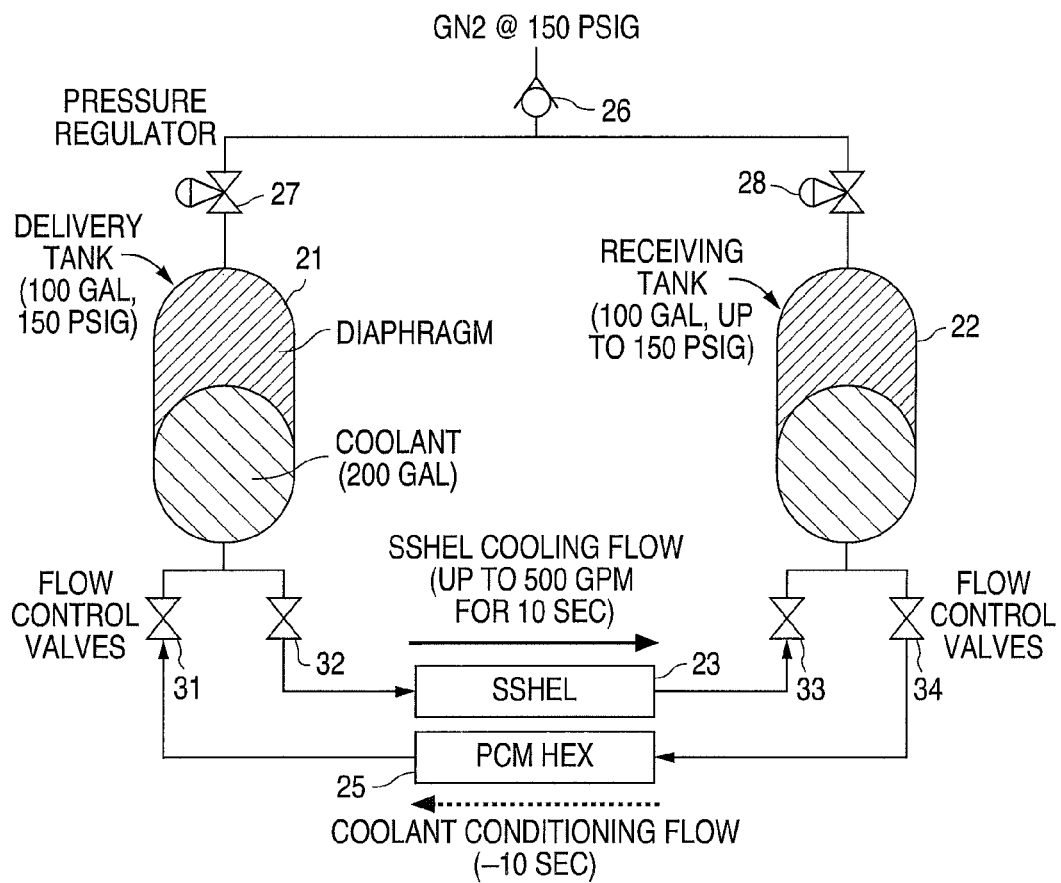
FIG. 2 shows a block diagram illustrating a system for cooling a solid state laser in accordance with an exemplary embodiment of the present invention.

FIG. 2 shows a first embodiment of the thermal management system of the present invention. According to the first embodiment, the thermal management system comprises a delivery or first tank 21, a receiving or second tank 22, and a phase change medium heat exchanger 25. Coolant can be caused to flow from first tank 21, through a HAP SSL 23 (also known as a solid state high energy laser or SSHEL) and then into second tank 22. As the coolant flows through HAP SSL 23, it effects cooling thereof.

Heated coolant that has flowed into second tank 22 can then be conditioned for reuse and transferred back into first tank 21. The heated coolant is conditioned for reuse by causing it to flow through phase change medium heat exchanger 25. In phase change medium heat exchanger 25, the heated coolant melts a phase change medium 62 (FIG. 6), thereby extracting heat from the coolant and thus substantially reducing the coolant's temperature. After passing through phase change medium heat exchanger 25, the coolant is thus conditioned for reuse and is stored once again in first tank 21. This process can repeat as desired.

Pressurized gas, such as nitrogen at approximately 150 psig, can be used to effect movement of coolant between first tank 21 and second tank 22 (and consequently through HAP SSL 23 and phase change medium heat exchanger 25). Check valve 26 facilitates the flow of pressurized gas into first tank 21 and second tank 22, while inhibiting the undesirable flow of pressurized gas therefrom (such as may otherwise occur if the gas source shut down, was depleted, and/or developed a leak). Pressure regulators 27 and 28 maintain a desired pressure of the gas within first tank 21 and second tank 22, respectively.

Flow control valves 31-34 can be configured to control the flow of fluid from first tank 21 to second tank 22 and vice-versa. For example, with the pressure of pressurized gas greater in first tank 21 than in second tank 22, with flow control valves 31 and 34 closed, and with flow control valves 32 and 33 open, fluid will flow from first tank 21 through HAP SSL 23 to second tank 22. Similarly, with the pressure of pressurized gas less in first tank 21 than in second tank 22, with flow control valves 31 and 34 open, and with flow control valves 32 and 33 closed, fluid will flow from second tank 22 through phase change medium heat exchanger 25 to first tank 21.

Thus, during HAP SSL lasing the coolant can be provided by first tank 21 (which is operating at a comparatively higher pressure) to HAP SSL 23 and subsequently collected by second tank 22 (which is operating at a comparatively lower pressure). During the non-lasing time the pressure of first tank 21 can be reduced and the pressure of second tank 22 can be increased. Valves 31-34 are then configured such that the coolant is transferred back to first tank 21 through phase change medium heat exchanger 25 (where the temperature of the coolant is substantially reduced, such as approximately back to its original temperature).

This type of fluid transport system (where a pressurized fluid is used to move another fluid, such as from one tank to another, can define a blow down system.

Figure 3:
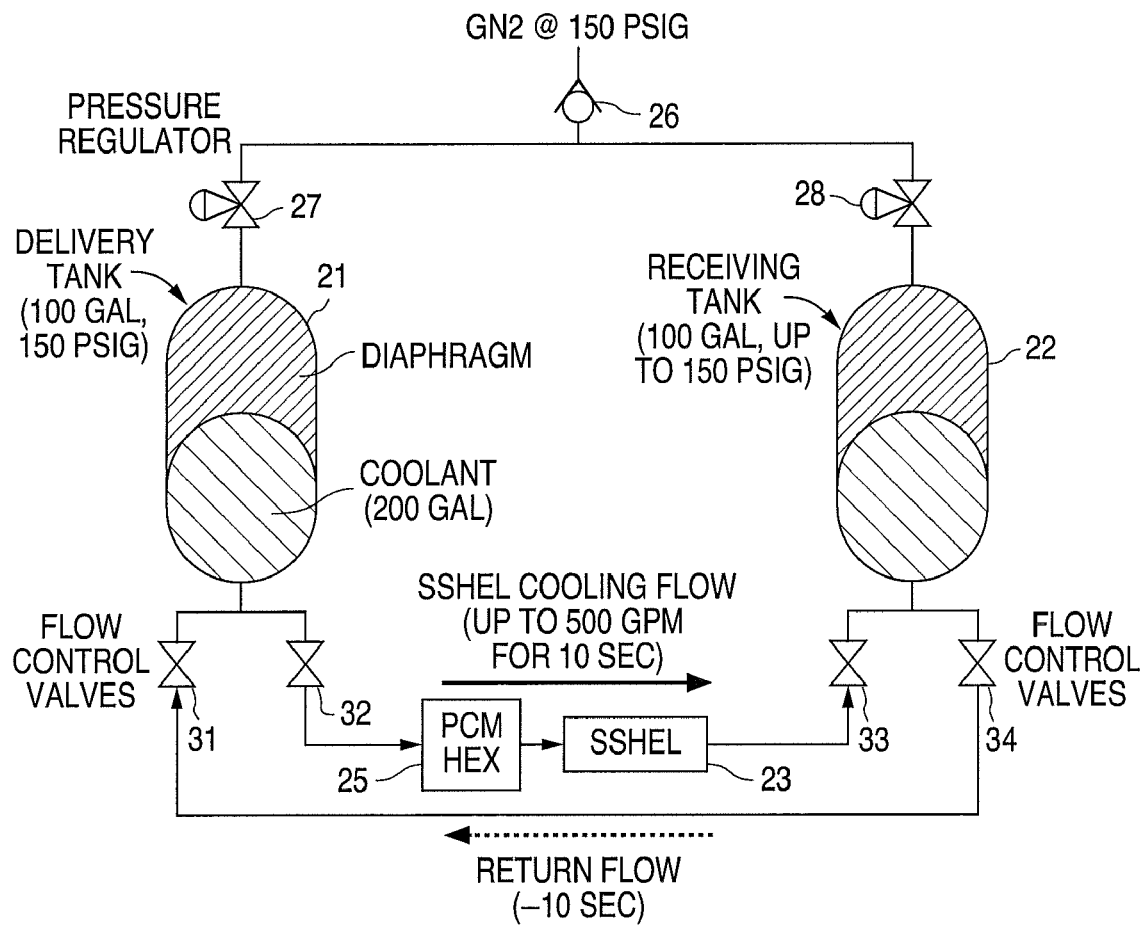
FIG. 3 shows a block diagram illustrating a system for cooling a solid state laser in accordance with another exemplary embodiment of the present invention.

FIG. 3 shows a second embodiment of the temperature management system of the present invention. According to the second embodiment, the thermal management system is similar to the first embodiment thereof, except that the phase change medium heat exchanger 25 is configured such that coolant flows therethrough as the coolant flows from first tank 21 to second tank 22 (instead of as the coolant flows from second tank 22 to first tank 21, as in the first embodiment of the present invention). That is, phase change medium heat exchanger 25 is placed upstream of HAP SSL 23 so that coolant provided by first tank 21 is conditioned immediately prior to delivery to HAP SSL 23. During the non-lasing time coolant can be transferred from second tank 22 back to first tank 21.

Figure 4:
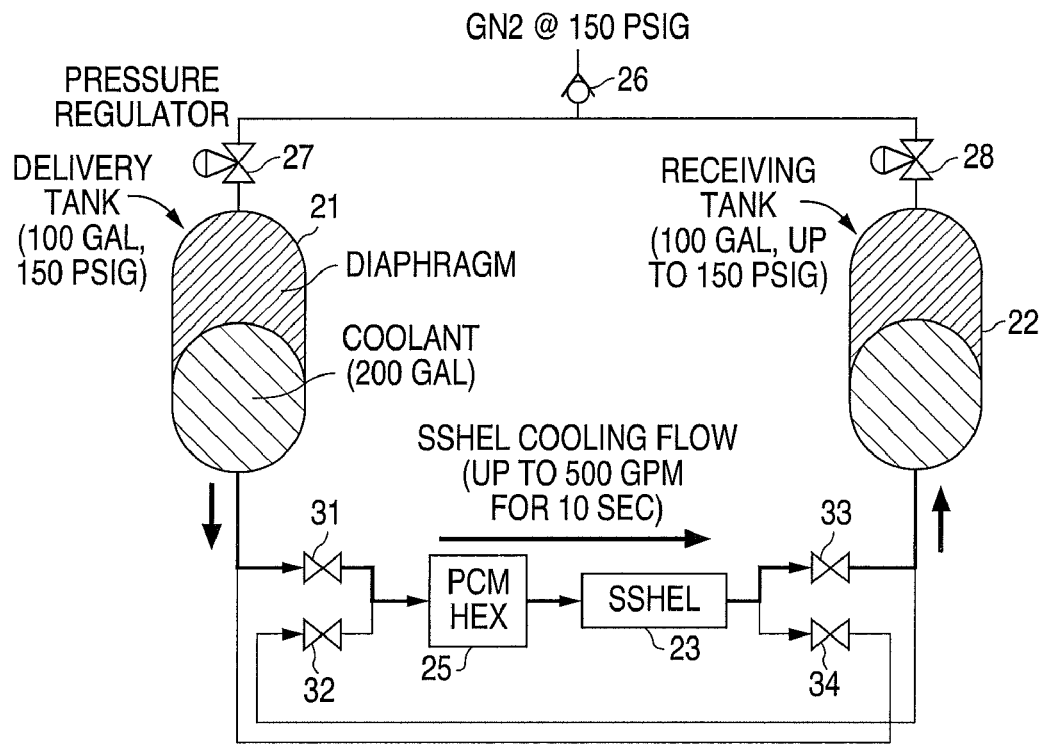
FIGS. 4 and 5 show block diagrams illustrating a system for cooling a solid state laser in accordance with yet another exemplary embodiment of the present invention.
Figure 5:
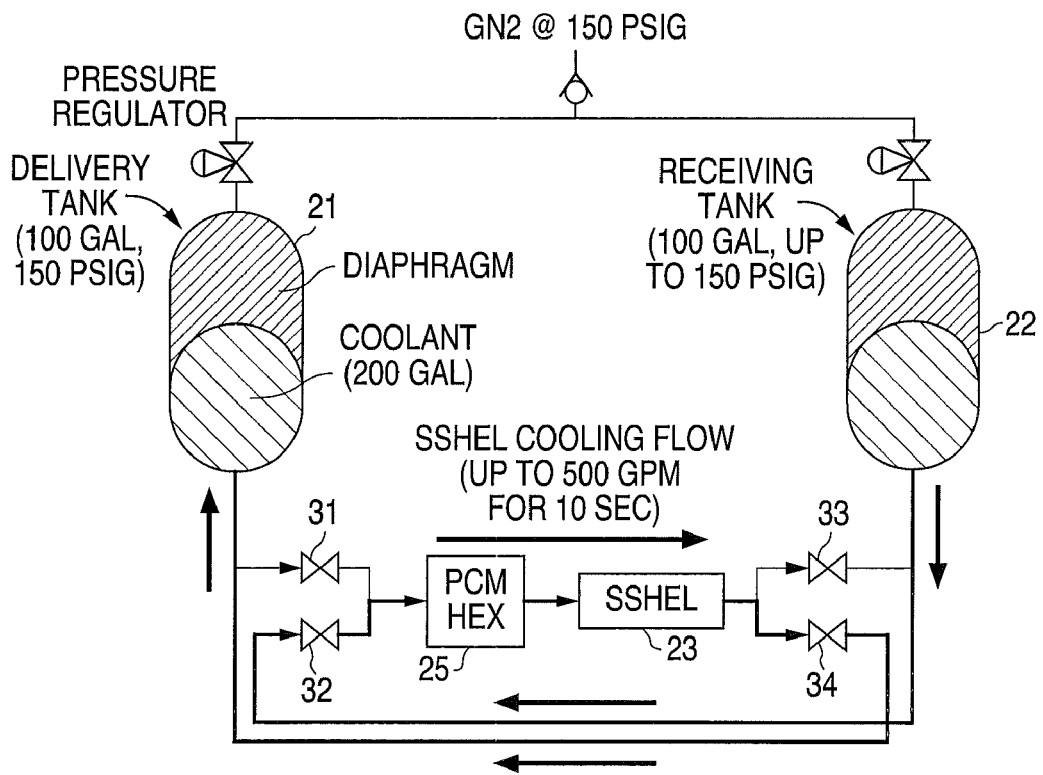

FIGS. 4 and 5 show a third preferred embodiment of the present invention, wherein either of the two tanks can operate as a delivery tank while the other tank operates as a receiving tank. Thus, their functions can be reversed for each coolant flow cycle. In each instance, valves 31-34 are configured such that phase change medium heat exchanger 25 is always upstream with respect to HAP SSL 23, i.e., so that coolant provided by the higher pressure tank is conditioned prior to delivery to HAP SSL 23. According to this embodiment of the present invention, it is not necessary to transfer the coolant during the non-lasing time.

For example, with the coolant initially in first tank 21, the coolant can be caused to flow through phase change medium heat exchanger 25 and HAP SSL 23, as shown in FIG. 4, by opening valves 31 and 33 while keeping valves 32 and 34 shut. The coolant is then received by second tank 22.

According to this embodiment of the present invention, there is no need to transfer the coolant back to the first tank 21 prior to using the coolant to cool HAP SSL 23 again. Thus, for the next use of HAP SSL 23, coolant from second tank 22 can be caused to flow through phase change medium heat exchanger and HAP SSL 23, as shown in FIG. 5, by opening values 32 and 34 while keeping values 31 and 33 shut. The coolant is then received by first tank 21.

Figure 6:
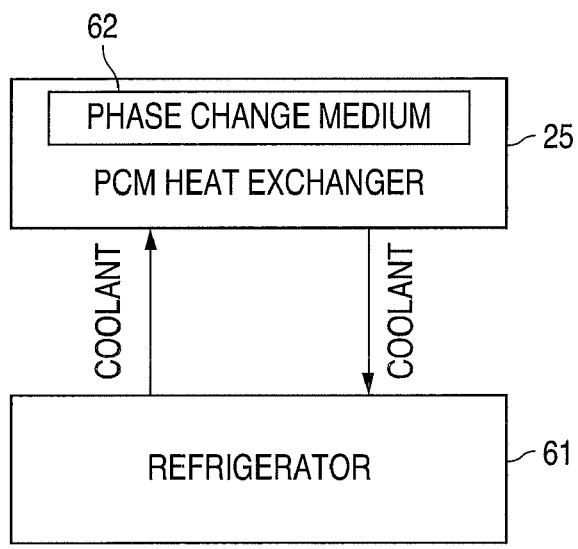
FIG. 6 shows a block diagram illustrating the use of a refrigerator to remove heat from the phase change medium of the phase change medium heat exchanger of FIGS. 2-5.

FIG. 6 shows the use of a refrigerator 61 to condition phase change medium 62 of phase change medium heat exchanger 25. That is, refrigerator 61 re-solidifies phase change medium 62 after phase change medium 62 has melted while conditioning the coolant. In this manner, phase change medium 62 can be made ready for another fire/cooling cycle of HAP SSL 23.

Refrigerator 61 can be substantially smaller than the refrigerator (such as refrigerator 16 of FIG. 1) used in contemporary HAP SSL systems, since refrigerator 61 does not directly and immediately cool HAP SSL 23. Rather, refrigerator 61 can take a comparatively longer time (such as an hour or more) to re-solidify phase change medium 62 and thereby condition phase change medium 62 for another use.

Operation of valves 31-34 for any embodiment of the present invention can be performed by remote control and/or can be automatic. Automatic control can be provided by a computer or other processor. A single valve assembly can incorporate all of valves 31-34, such as to simplify operation (by requiring that only a single action be performed to change the state of all valves 31-34). Pressure regulators 27 and 28 can be remotely operated by pneumatic, hydraulic, and/or electric means and can be under computer control.

One or more embodiments of the present invention make it possible to manufacture more powerful and yet more economical HAP SSL systems. Thus, the present invention is expected to enable new applications such as rock drilling for oil and gas exploration.

Although described herein as being used with a solid state laser, those skilled in the art will appreciate that the thermal management system of the present invention is suitable for use with other types of lasers, as well as other types of directed energy devices. Thus, use of the thermal management system of the present invention with a solid state laser is by way of example only, and not by way of limitation.

In view of the foregoing, at least one embodiment of the present invention provides a lightweight, compact, low cost thermal management system for a high energy solid state laser (HAP SSL) weapon. Because of its size and weight, the thermal management system facilitates the use of HAP SSL systems on mobile platforms. At least one embodiment of the present invention further provides a thermal management system that has very quiescent flow of coolant at the flow rates required for effective cooling. At least one embodiment of the present invention has no moving parts other than the valves and refrigerator, and is thus comparatively easy to use.

Embodiments described above illustrate but do not limit the invention. It should also be understood that numerous modifications and variations are possible in accordance with the principles of the present invention. Accordingly, the scope of the invention is defined only by the following claims.

I claim:

1. A method for cooling a solid state laser, the method comprising:
    firing the solid state laser; and,
    moving a liquid coolant through a phase change medium heat exchanger immediately prior to use of the liquid coolant for laser cooling,
    wherein either one of two tanks can operate as a delivery tank while the other one of the two tanks operates as a receiving tank such that the functions of the two tanks are reversible for each coolant flow cycle.

2. The method of claim 1, wherein moving the liquid coolant through the phase change medium heat exchanger comprises:
    communicating the liquid coolant from either a first coolant tank or a second coolant tank to the phase change medium heat exchanger prior to communicating the coolant to the laser; and,
    communicating the liquid coolant from the laser to the second coolant tank or the first coolant tank, respectively, after cooling the laser.

3. The method of claim 1, wherein:
    a first plurality of valves are open and a second plurality of valves are closed to facilitate operation of one of the two tanks as a delivery tank and to facilitate operation of the other of the two tanks as a receiving tank; and,
    the first plurality of valves are closed and the second plurality of valves are open to reverse the function of the two tanks.

4. The method of claim 1, further comprising transferring heat from the phase change medium of the phase change medium heat exchanger via a refrigerator.

5. The method of claim 2, further comprising using pressurized gas to urge liquid coolant from at least one of the first coolant tank and the second coolant tank.

6. The method of claim 5, further comprising preventing mixing of the coolant and the pressurized gas in at least one of the first coolant tank and the second coolant tank via at least one device selected from the group consisting of a diaphragm and a bladder.

7. The method of claim 5, further comprising inhibiting sloshing of the liquid coolant in at least one of the first coolant tank and the second coolant tank via at least one device selected from the group consisting of a diaphragm and a bladder.

8. The method of claim 1, wherein the phase change medium of the phase change medium heat exchanger comprises at least one substance selected from the group consisting of paraffin wax and Glauber salt.

9. A cooling system for cooling a solid state laser, the system comprising:
    a phase change medium heat exchanger;
    a liquid coolant that flows through the phase change medium heat exchanger; and,
    a first tank and a second tank,
    wherein the phase change medium heat exchanger is configured such that the liquid coolant flows therethrough immediately prior to use of the coolant for laser cooling, and
    either one of the first tank and second tank can operate as a delivery tank while the other one of the first tank and second tank operates as a receiving tank such that the functions of the first tank and second tank are reversible for each coolant flow cycle.

10. The system as of claim 9, further comprising:
    a first coolant tank configured for storing the coolant prior to being cooled by the phase change heat exchanger and cooling the laser; and,
    a second coolant tank configured for storing the coolant after cooling the laser.

11. The system as recited in claim 9, further comprising:
    a first coolant tank and a second coolant tank;
    wherein the coolant can be stored in either the first coolant tank or the second coolant tank prior to being cooled by the phase change heat exchanger and cooling the laser; and,
    wherein the coolant may be then stored in the second or the first coolant tank, respectively, after cooling the laser.

12. The system of claim 9, further comprising:
    a first plurality of valves and a second plurality of valves;
    wherein the first plurality of valves are open and the second plurality of valves are closed to facilitate operation of one of the two tanks as a receiving tank and to facilitate operation of the other of the two tanks as a receiving tank; and,
    the first plurality of valves are closed and the second plurality of valves are open to reverse the function of the two tanks.

13. The system of claim 9, further comprising a refrigerator for removing heat from a phase change medium of the phase change medium heat exchanger.

14. The system of claim 10, further comprises a pressure source for pressurizing one or more of the first coolant tank and the second coolant tank using a gas, the pressure source being selected from the group consisting of a gas bottle, a gas tank, and a compressor.

15. The system of claim 14, further comprising:
    a first diaphragm or first bladder for separating coolant from pressurized gas in the first coolant tank; and,
    a second diaphragm or second bladder for separating coolant from pressurized gas in the second coolant tank.

16. The system of claim 10, further comprising:
    a first diaphragm or first bladder for inhibiting sloshing of coolant in the first coolant tank; and,
    a second diaphragm or second bladder for inhibiting sloshing of coolant in the second coolant tank.

17. A cooling system for cooling a solid state laser, the system comprising:
    a liquid coolant;
    means for removing heat from the coolant;
    means for urging the coolant through the removing means immediately prior to use of the laser, wherein the coolant flows through the removing means to the laser to cool the laser, and,
    first and second coolant storage tanks, wherein either one of the coolant storage tanks can operate as a coolant delivery tank while the other one of the coolant storage tanks operates as a coolant receiving tank such that the functions of the first and second coolant storage tanks are reversible for each coolant flow cycle.

18. The system of claim 17, further comprising:
    means for urging the coolant from the first coolant storage tank to the removing means;
    and,
    means for urging the coolant after cooling the laser from the laser to the second coolant storage tank.

* * * * *